United States Patent [19]
Miura

[11] Patent Number: 5,379,067
[45] Date of Patent: Jan. 3, 1995

[54] CCD LINEAR SENSOR AND METHOD OF READING-OUT CHARGES THEREFROM

[75] Inventor: Hisanori Miura, Hyogo, Japan

[73] Assignee: Sony Corporation, Tokyo, Japan

[21] Appl. No.: 41,032

[22] Filed: Mar. 31, 1993

[30] Foreign Application Priority Data

Apr. 3, 1992 [JP] Japan .................. 4-082262

[51] Int. Cl.6 .................. H04N 3/14; H04N 5/325
[52] U.S. Cl. .................. 348/311; 348/294;
348/297; 348/303; 348/304; 348/316; 257/232;
257/233; 257/243; 257/246
[58] Field of Search .................. 358/213.27, 213.11,
358/213.23, 213.29; 250/208.1; 257/232, 233,
243, 246; 348/294, 297, 303, 309, 305, 314, 316,
319, 230, 311

[56] References Cited

U.S. PATENT DOCUMENTS

| | | | |
|---|---|---|---|
| 4,367,492 | 1/1983 | Harada et al. | 358/217 |
| 4,829,368 | 5/1989 | Kobayashi et al. | 358/41 |
| 4,985,776 | 1/1991 | Taniji | 358/213.23 |
| 5,182,622 | 1/1993 | Iizuka et al. | 257/231 |
| 5,243,180 | 9/1993 | Nam | 250/208.1 |

FOREIGN PATENT DOCUMENTS 2214059 8/1989 Japan .................. H01L 27/14

Primary Examiner—Joseph Mancuso
Assistant Examiner—Bipin Shalwala
Attorney, Agent, or Firm—Hill, Steadman & Simpson

[57] ABSTRACT

A CCD linear sensor. A photosensor row has photosensitive regions. Read-out gate electrodes and shift registers are formed on opposite sides of the photosensor row. A channel separating region is formed along the center of the photosensor row for separating each of the photosensitive region into two photosensitive portions. Charges accumulated in the photosensitive portions are read-out dividedly in both directions through the read-out gate electrodes to the shift registers. In the CCD linear sensor, the length of charge transfer path is reduced, therefore, charge reading-out time can be reduced.

2 Claims, 5 Drawing Sheets

CCD LINEAR SENSOR AND METHOD OF READING-OUT CHARGES THEREFROM

FIELD OF THE INVENTION

The present invention relates to a CCD linear sensor and a method of operation. In particular, it relates to a linear sensor in which signal charges accumulated in photosensitive regions are transferred through read-out gates to shift registers of the CCD, and to a method of reading-out the signal charges from the photosensitive regions.

BACKGROUND OF THE INVENTION

As shown in FIG. 1, a conventional CCD linear sensor has photosensitive regions 21 separated at every pixels. Read-out gate electrodes 22a, 22b and shift registers 23a, 23b are formed common to the photosensitive regions 21. An output unit 25 is formed at the output of the shift registers 23a and 23b.

During a charge accumulating period, signal charges e corresponding to picked-up image information are accumulated in the photosensitive regions 21. During the next reading-out period, a read-out pulse $\phi r$ is supplied to the read-out gate electrodes 22a and 22b. The signal charges e accumulated in odd-numbered photosensitive regions 21 to be transferred through one read-out gate electrode 22a to one shift register 23a. The signal charges e accumulated in even-numbered photosensitive regions 21 to be transferred through the other read-out gate electrode 22b to the other shift register 23b.

The signal charges e transferred to the shift registers 23a and 23b are further transferred in the horizontal direction, or to an output unit 25 by supplying two transfer pulses $\phi 1$ and $\phi 2$ of different phases to the shift registers 23a and 23b. The output unit 25 rearranges sequentially the signal charges e transferred in parallel from the shift registers 23a and 23b into a series of those signal charges e. Then, the output unit 25 converts the signal charges into voltages, which are output as an image signal S from an output terminal $\phi$out.

In a conventional CCD linear sensor, however, the signal charges e accumulated in each of the photosensitive region 21 are read-out from a single side of each photosensitive region 21. In other words, the signal charges accumulated in the odd-numbered photosensitive regions 21 are read-out through one read-out gate electrode 22a to one shift register 23a. On the other hand, the signal charges accumulated in the even-numbered photosensitive regions 21 are read-out through the other read-out gate electrode 22b to the other shift register 23b.

Therefore, in the conventional CCD linear sensor, the length L of charge transfer paths of the photosensitive regions 21 which is measured in the reading-out direction is long. So, it takes a long time to read-out the signal charges e. In addition, part of the signal charges e remains within the charge transfer paths, or so-called transfer residue occurs.

SUMMARY OF THE INVENTION

In view of the circumstances mentioned, it is an object of the present invention to provide a CCD linear sensor and a method of reading-out charges from the CCD linear sensor, which are capable of greatly reducing the time in which the signal charges accumulated in photosensitive regions are read-out to shift registers, and the charge reading-out time.

In one aspect of the present invention, a CCD linear sensor includes a photosensor row which has photosensitive regions separated at every pixels by channel stopper regions and arranged in one direction, read-out gate electrodes and shift registers which are formed on opposite sides of the photosensor row and are common to the photosensitive regions, an output unit which is formed at the output of the shift registers, and a channel separating region which is formed along the center of the photosensor row in the one direction for separating each of the photosensitive region into two photosensitive portions.

In another aspect of the present invention, a method of reading-out charges from a CCD linear sensor includes the photosensor row having the photosensitive regions, the read-out gate electrodes, the shift registers and channel separating regions for separating each of the photosensitive region into two photosensitive portions in which the charges are accumulated in the photosensitive portions, and then the charges are read-out dividedly in both directions through the read-out gate electrodes to the shift registers by applying a read-out pulse to the read-out gate electrodes.

In accordance with the present invention, the channel separating region is formed along the center of the photosensor row, the length of charge transfer paths is reduced to about ½ that in the conventional CCD linear sensor, and the potential gradient of the transfer paths is twice that in the conventional CCD linear sensor. Thus, the time in which the signal charges e accumulated in the photosensitive portions are read-out to the shift registers, or the charge reading-out time t, can be reduced to ¼ that in the conventional CCD linear sensor.

Moreover, according to the charge reading-out method of the present invention, since the signal charges e of the photosensitive regions are read-out through the read-out gates to the shift registers on both sides of the photosensor row, the signal charges e accumulated in the photosensitive regions can be read-out from both sides at the same time. Therefore the reading time t for the signal charges e can be reduced as compared with the conventional method in which the charges are read-out only from one side.

BRIEF DESCRIPTION OF THE DRAWINGS

The invention will be more readily understood with reference to the accompanying drawing, wherein.

DETAILED DESCRIPTION OF THE PREFERRED EMBODIMENTS

The preferred embodiment of the present invention will be described in detail by referring to FIGS. 2 to 6.

Figure 2:
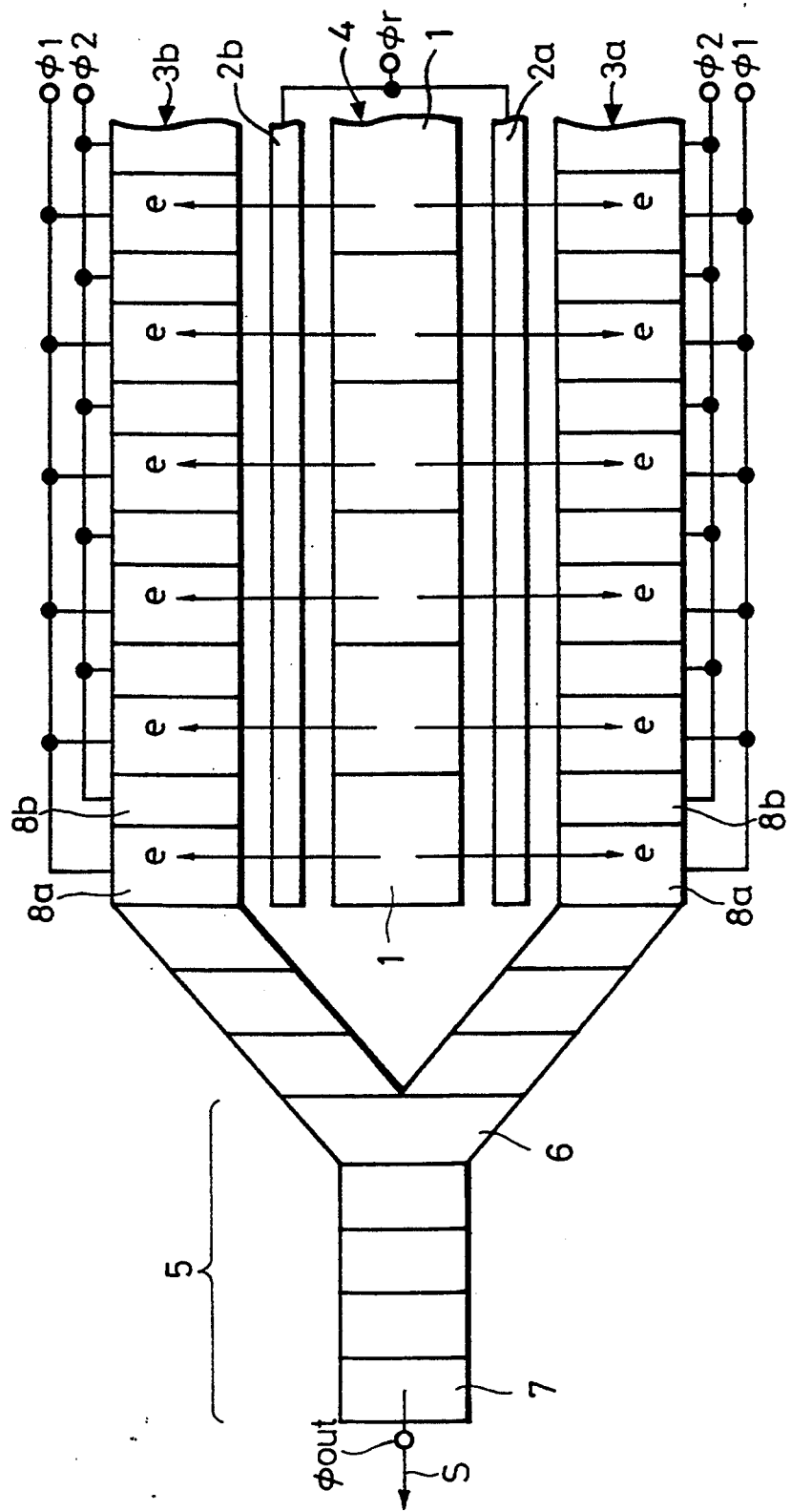
FIG. 2 is a schematic construction of an embodiment representing the CCD linear sensor of the present invention.

As shown in FIG. 2, the CCD linear sensor in this embodiment has photosensitive regions 1 separated at every pixel. Photosensitive regions 1 are arranged in single photosensor row 4. Read-out gate electrodes 2a and 2b are foraged on the opposite sides of the photosensor row 4 respectively and common to the photosensitive regions 1. Shift registers 3a and 3b are formed on the opposite sides of the read-out gate electrodes 2a and 2b to the photosensor row 4 respectively and common to the photosensitive regions 1.

An output unit 5 is formed at the output of the shift registers 3a and 3b. The output unit 5 has a signal compounder 6 and a charge-voltage converter 7. Each of the shift registers 3a and 3b have two transfer electrodes 8a and 8b at each photosensitive region 1. The transfer electrodes 8a and 8b of each photosensitive region 1 are supplied with the two different-phase transfer pulses $\phi 1$ and $\phi 2$, respectively.

Figure 3:
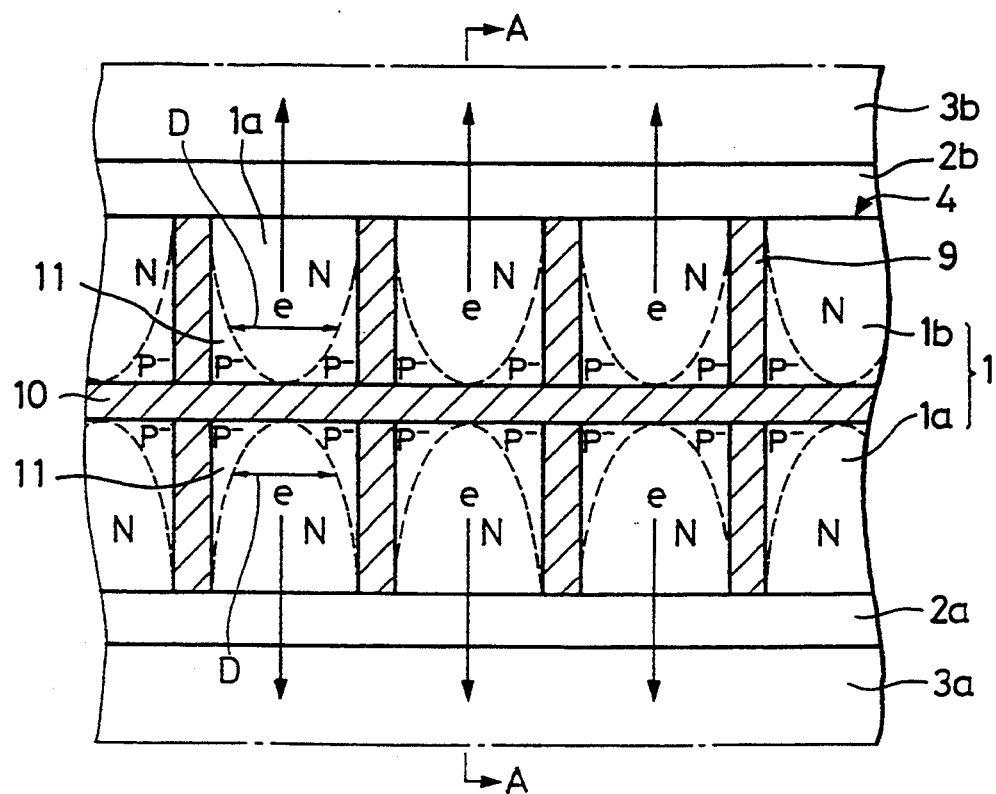
FIG. 3 is a plan view of the construction of around photosensitive regions of the CCD linear sensor of the embodiment.

As shown in FIG. 3, the photosensor row 4 has photosensitive regions 1 which are separated at every pixel by channel stopper regions 9 which are formed by, for example, p-type impurity diffusion, and arranged in one direction (in a horizontal direction). In this embodiment, channel separating region 10 is also formed within the photosensor row 4 so as to extend along the center in one direction. This channel separating region 10 is supplied with and kept at the same potential as the channel stopper regions 9. Therefore, the photosensitive region 1 at each pixel is separated into two photosensitive portions, or first and second photosensitive portions 1a and 1b by channel separating region 10.

Each of the photosensitive portions 1a and 1b is formed by, for example, a photodiode of the PN junction between a P-type silicon substrate or well region and an N-type impurity diffused region (not shown) formed on the surface of the former substrate or well region. In addition, the photosensitive portions 1a and 1b have low-concentration P-type impurity diffused regions 11 formed over the range from near the intersections of the channel separating region 10 and the channel stopper regions 9, to the read-out gate electrodes 2a and 2b, respectively.

Figure 5:
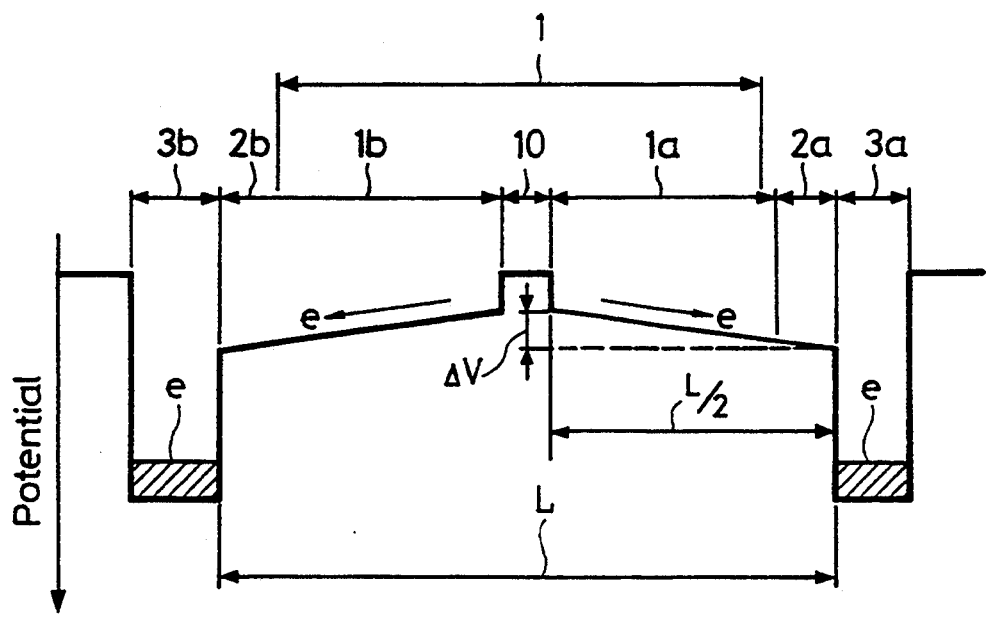
FIG. 5 is a potential diagram taken along a line A—A in FIG. 3.

This impurity diffused region 11 acts to continuously widen the width D of the N-type photosensitive portions 1a and 1b toward the read-out gate electrodes 2a and 2b. As shown in FIG. 5, therefore, the potentials of the photosensitive portions 1a and 1b can be sloped down toward the read-out gate electrodes 2a and 2b by this impurity diffused regions 11. This potential gradient can increase the transfer efficiency of the signal charges e, and prevent part of the charges from remaining within the photosensitive portions 1a and 1b.

During a charge accumulating period, signal charges e corresponding to picked-up image information are accumulated in the photosensitive portions 1a and 1b of each pixel. During the next reading-out period, the signal charges e accumulated in the photosensitive portions 1a and 1b are dividedly transferred in both directions through the read-out gate electrodes 2a and 2b to the shift registers 3a and 3b by applying the read-out pulse $\phi r$ to the read-out gate electrodes 2a and 2b.

The divided parts of the signal charges e of each pixel which have been transferred to the shift registers 3a and 3b are further transferred to the output unit 5 by applying the two different-phase transfer pulses $\phi 1$ and $\phi 2$ to the transfer electrodes 8a and 8b. The signal compounder 6 of the output unit compounds the divided parts of the signal charge e of each pixel which have been transferred in parallel from the shift registers 3a and 3b. The following charge-voltage converter 7 converts the compound, or full signal charge e into a voltage. The voltage is then output as the image signal S from the output terminal $\phi$out.

Figure 6:
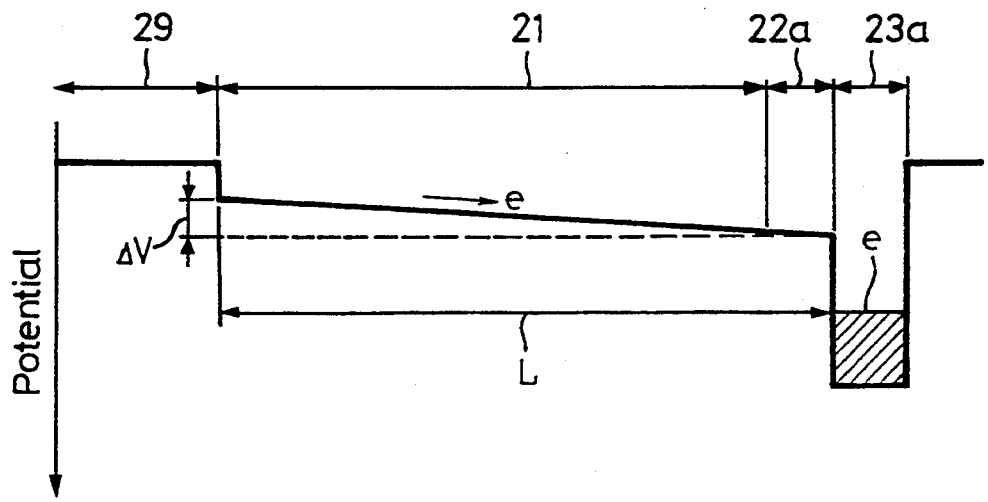
FIG. 6 is a potential diagram taken along a line B—B in FIG. 4.

With reference to FIGS. 5 and 6, a description will be made to compare the time for reading-out the signal charges e from the CCD linear sensor of this embodiment with that from an example CCD linear sensor for comparison.

Figure 1:
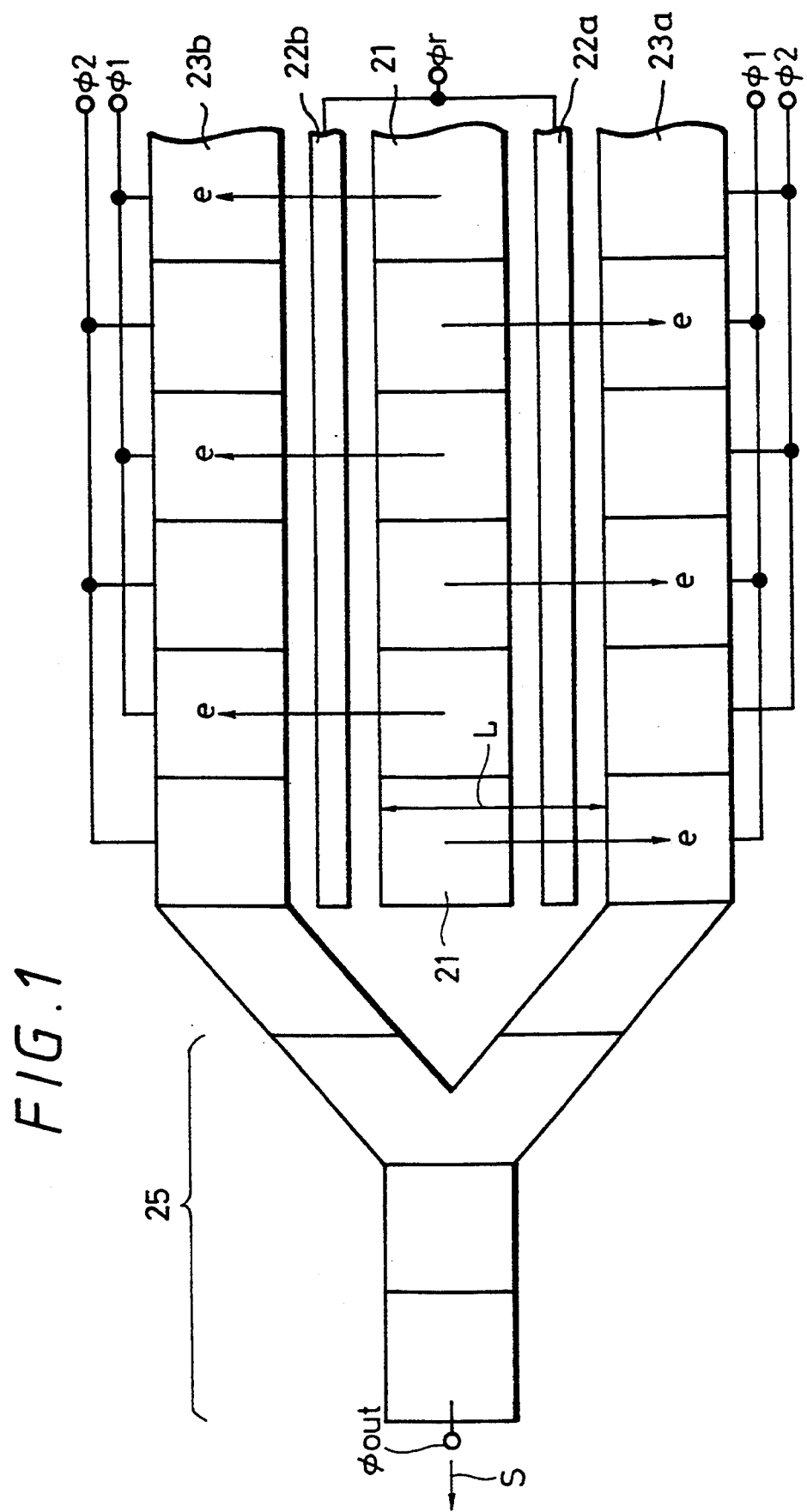
FIG. 1 is a schematic construction of a conventional CCD linear sensor.
Figure 4:
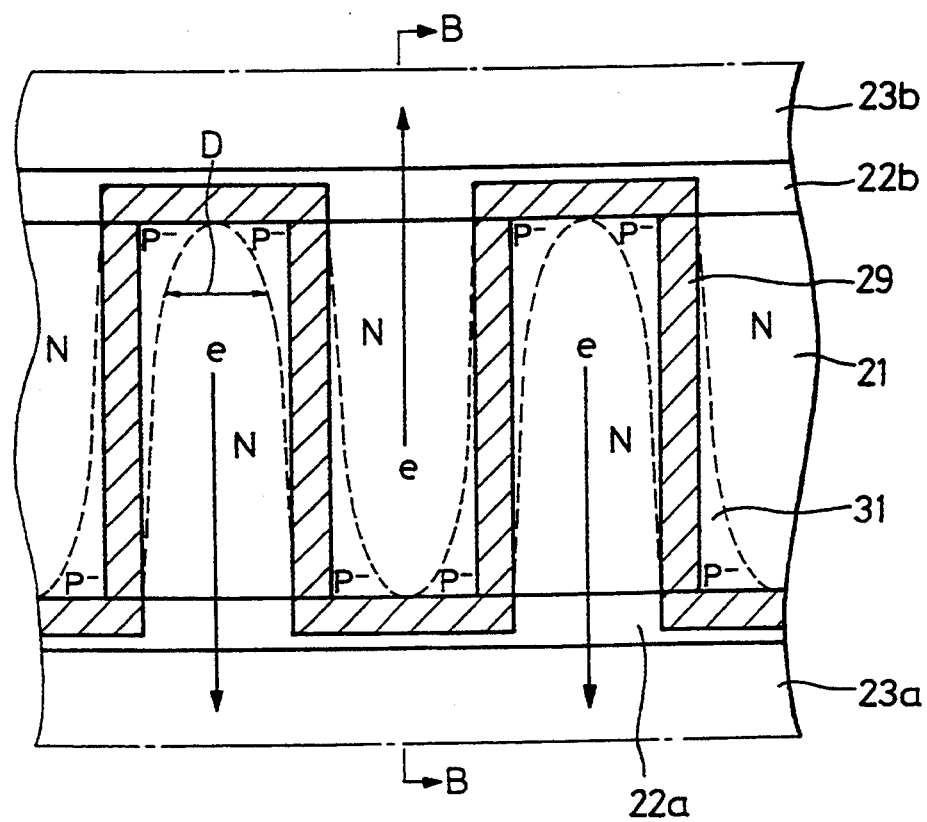
FIG. 4 is a plan view of the construction of around photosensitive regions of a CCD linear sensor of an example for comparison.

In comparison with the foregoing conventional CCD linear sensor of FIG. 1, this example for comparison, as shown in FIG. 4 is different in that a P-type low-concentration impurity diffused region 31 is formed within each photosensitive region 21 at the opposite side to the charge reading-out direction. So, the width D of the N-type photosensitive regions 21 can be continuously widened toward the read-out gate electrode 22a or 22b to which the charges are transferred. Therefore, as shown in FIG. 6, the potential within each photosensitive region 21 is sloped down toward the read-out gate electrode (22a in the illustrated example) to which the charges are transferred.

According to the CCD linear sensor of this embodiment, as shown in FIG. 5 and TABLE 1 at (1), the maximum length of the charge transfer path of the photosensitive region 1a is L/2, and the potential gradient is $2 \cdot \Delta V/L$. Thus, the reading time t for the signal charges e is proportional to $L^2/(4 \cdot \Delta V)$. Where, L is the length of the charge transfer path including the photosensitive portion (for example, 1a) and the read-out gate electrode (for example, 2a), and $\Delta V$ is the potential difference between the potentials at the read-out gate electrode 2a side end and the channel separating region 10 side end of the photosensitive region (for example, 1a).

In the CCD linear sensor of the example for comparison, as shown in FIG. 6 and TABLE 1 at (2), the maximum length of the charge transfer path of the photosensitive region 21 is L, and the potential gradient is $\Delta V/L$. Thus, the reading-out time t for the signal charge e is proportional to $L^2/\Delta V$. L is the length of the charge transfer path including the photosensitive region 21 and the read-out gate electrode 22a, and $\Delta V$ is the potential difference between the potentials at the read-out gate electrode 22a side end and the channel stopper region 29 side end of the photosensitive region 21.

TABLE 1

| | POTENTIAL GRADIENT | MAXIMUM LENGTH | READING-OUT TIME |
|---|---|---|---|
| (1) EMBODIMENT | $2 \cdot \Delta \frac{V}{L}$ | $\frac{L}{2}$ | $t \propto \frac{L^2}{4 \cdot \Delta V}$ |
| (2) EXAMPLE FOR COMPARISON | $\Delta \frac{V}{L}$ | L | $t \propto \frac{L^2}{\Delta V}$ |

From TABLE 1, it will be seen that in the CCD linear sensor of this embodiment, the reading-out time t for the signal charges e can be greatly reduced to $\frac{1}{4}$ that in the CCD linear sensor of the example for comparison.

According to this embodiment, as mentioned above, the transfer residue of signal charges e at the photosensitive regions 1a and 1b can be prevented, and the reading-out time t for the signal charges e can be greatly reduced. Therefore, according to the CCD linear sensor of this embodiment, an image lag can be reduced, and the signal charges e can be read-out at a high speed.

While specific embodiment of the present invention have been shown and disclosed, it is to be understood that numerous changes and modifications may be made by those skilled in the art without departing from the scope and intent of the invention.

What is claimed is:

1. A CCD linear sensor comprising:

a photosensor row having photosensitive regions separated at every pixels by channel stopper regions and arranged in one direction;

read-out gate electrodes formed on opposite sides of said photosensor row and being common to said photosensitive regions;

shift registers formed on opposite sides of said read-out gate electrodes and being common to said photosensitive regions;

an output unit formed at the output of said shift register wherein a channel separating region is formed along the center of said photosensor row, in said one direction for separating each of said photosensitive region into two photosensitive portions;

wherein said channel separating region is kept at the same potential as said channel stopper regions; and wherein an impurity diffused region is formed at an intersection of said channel stopper region and said channel separating region in each of said photosensitive portions and forming a generally U-shape so as to facilitate the movement of charges from said two photosensitive portions toward said shift registers.

2. A CCD linear sensor comprising:

a photosensor row having N-type photosensitive regions separated at every pixels by p-type channel stopper regions and arranged in one direction read-out gate electrodes formed on opposite sides of said photosensor row and being common to said photosensitive regions;

shift registers formed on opposite sides of said read-out gate electrodes and being common to said photosensitive regions;

a P-type channel separating region formed along the center of said photosensor row in said one direction and kept at the same potential as said channel stopper regions for separating each of said photosensitive regions into two photosensitive portions;

a P-type impurity diffused region formed at intersection of said channel stopper region and channel separating region in said each photosensitive portion, and forming a generally U-shape so as to facilitate the movement of charges from said two photosensitive portions toward said shift registers.

* * * * *